(12) United States Patent
Gogl et al.

(10) Patent No.: US 6,639,829 B2
(45) Date of Patent: Oct. 28, 2003

(54) CONFIGURATION AND METHOD FOR THE LOW-LOSS WRITING OF AN MRAM

(75) Inventors: Dietmar Gogl, Fishkill, NY (US); Helmut Kandolf, München (DE); Stefan Lammers, München (DE)

(73) Assignee: Infineon Technologies AG, Munich (DE)

(*) Notice: Subject to any disclaimer, the term of this patent is extended or adjusted under 35 U.S.C. 154(b) by 197 days.

(21) Appl. No.: 09/922,471

(22) Filed: Aug. 3, 2001

(65) Prior Publication Data

US 2002/0021543 A1 Feb. 21, 2002

(30) Foreign Application Priority Data

Aug. 3, 2000 (DE) .......................................... 100 37 976

(51) Int. Cl.⁷ ............................................... G11C 11/00
(52) U.S. Cl. .............................. 365/158; 365/8; 365/55; 365/66; 365/171
(58) Field of Search .................. 365/158, 171, 365/173, 8, 55, 66, 157

(56) References Cited

U.S. PATENT DOCUMENTS

| 4,338,678 A | 7/1982 | Akatsuka |
| 6,130,835 A | * 10/2000 | Scheuerlein ................ 365/171 |
| 6,424,562 B1 | * 7/2002 | Rosner et al. .............. 365/158 |
| 6,490,191 B2 | * 12/2002 | Pochmuller ................. 365/158 |
| 6,490,217 B1 | * 12/2002 | DeBrosse et al. ........ 365/225.5 |

FOREIGN PATENT DOCUMENTS

WO    PCT/DE98/02589    3/1999

* cited by examiner

Primary Examiner—Vu A. Le
Assistant Examiner—Nam Nguyen
(74) Attorney, Agent, or Firm—Laurence A. Greenberg; Werner H. Stemer; Ralph E. Locher

(57) ABSTRACT

A configuration and method for low-loss writing of an MRAM includes setting voltages at bit lines and word lines such that the voltage across the memory cells between a selected word/bit line and the individual bit line/word lines is minimal. A voltage drop occurs on a selected word/bit line connected to a particular memory cell when writing into the memory cell and voltages at the bit/word lines are set to minimize a cell voltage across the memory cells between a selected word/bit line and individual bit/word lines. A voltage drop occurs on a selected word/bit line connected to a particular memory cell when writing into the particular cell, and, when a voltage V1 and a voltage V2<V1 are present at a respective end of the selected word line/bit lines, the cell field is configured to have all of the bit/word lines set to voltages (V1+V2)/2 and to have a maximum cell voltage of ±(V1−V2)/2.

24 Claims, 3 Drawing Sheets

PRIOR ART
Fig. 4 A
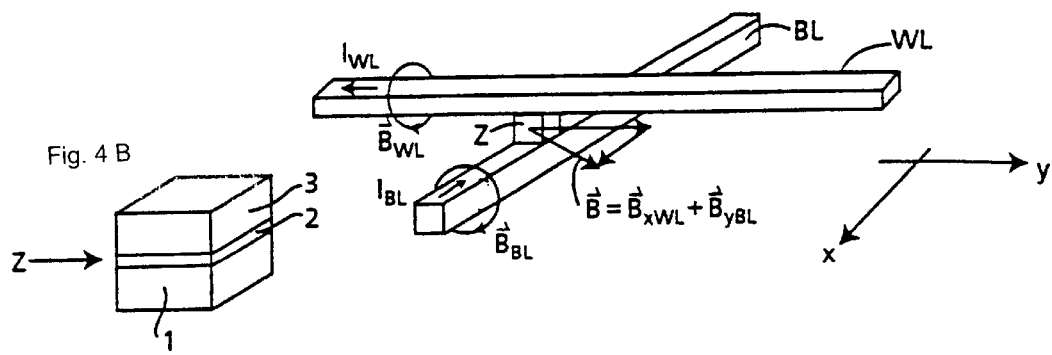
Fig. 4 B
Fig. 5
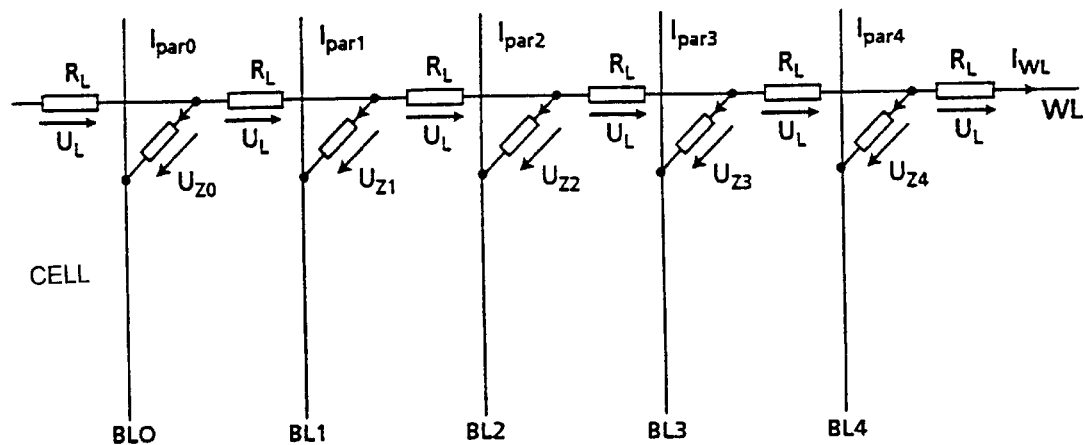

CONFIGURATION AND METHOD FOR THE LOW-LOSS WRITING OF AN MRAM

BACKGROUND OF THE INVENTION

Field of the Invention

The invention relates to a configuration for the low-loss writing of an Magneto-Resistive Random Access Memory (MRAM) having a plurality of cells that are provided between respective word lines and bit lines in a cell field, whereby, given writing into a particular memory cell, a voltage drop occurs on the selected word line and bit line that are connected to such a cell.

FIG. 4A is a schematic illustration of a conventional MRAM cell with a word line WL running in direction y and a bit line BL running in the perpendicular direction x, which crosses the word line at a distance. Between the word line WL and the bit line BL, there is a conventional memory cell Z, shown in FIG. 4B, which includes a hard-magnetic layer 1, a tunnel barrier layer 2, and a soft-magnetic layer 3 disposed in a layer stack between the word line WL and the bit line BL.

To store the desired data item in such an MRAM cell, a current $I_{WL}$ is impressed on the word line WL, and a current $I_{BL}$ is impressed on the bit line BL. These currents $I_{WL}$ and $I_{BL}$ generate magnetic fields $B_{WL}$ and $B_{BL}$, respectively. Thus, at the crossing of the word line WL and bit line BL, i.e., in the region of the memory cell Z, a magnetic field $B_{xWL}$ runs in direction x due to the current $I_{WL}$ flowing through the bit line BL, and a magnetic field $B_{yBL}$ runs in direction y due to the current $I_{BL}$ flowing through the bit line BL. The total magnetic field B formed by the sum of the two magnetic fields $B_{xWL}$ and $B_{yBL}$ directs the soft-magnetic layer 3 of the cell Z in a particular direction, which may be parallel or antiparallel to the magnetization of the hard-magnetic layer 1. The memory cell Z thus stores a logical 1 or 0 depending upon the parallel or antiparallel magnetization of the two layers 1 and 3, to which a low or high resistance value is allocated, respectively.

In a write operation, the word line current $I_{WL}$ flows through the word line WL. But because the word line WL has a resistance $R_L$ in each of its subsections between individual bit lines BL0, BL, ..., a voltage drop $U_L$ occurs in each subsection as a result of the line resistance along the word line WL. Such voltage drop $U_L$ brings about voltage differences $U_{Z0}, U_{Z1}, U_{Z2}, \ldots$ across the individual cells Z, thereby causing parasitic currents $I_{par0}, I_{par1}, I_{par2}, \ldots$ to flow through the cells Z, as represented in FIG. 5.

The current $I_{WL}$ flowing in the word line WL is damped along the word line WL by these parasitic currents $I_{par0}, I_{par1}, \ldots$, and, therefore, reliable writing, which requires a certain intensity of the current $I_{WL}$ in the word line WL, can no longer be guaranteed. In other words, due to the parasitic currents $I_{par0}, I_{par1}, \ldots$, the strength of the current $I_{WL}$ flowing in the word line WL must be elevated.

But such an elevation of the current $I_{WL}$ flowing in the word line WL is limited, because an excessive current $I_{WL}$ in the word line WL could lead to the writing of all cells along such a word line WL without the co-operation of a respective bit line BL0, BL1. In other words, given an excessively high current in the word line WL, it is no longer possible to select the memory cells.

To keep the parasitic currents $I_{par0}, I_{par1}, \ldots$ optimally small given these conditions, it would be imaginable either to provide for an optimally high resistance of the memory cells or to shorten the length of the word lines WL. However, both measures are associated with material disadvantages in that high resistances of the memory cells reduce the read current through these cells and, thus, complicate a reliable reading. On the other hand, short word lines reduce the efficiency of the MRAM, that is to say, of the memory chip, and, thus, raise the cost of production. The same concerns arise with respect to the bit lines, accordingly.

SUMMARY OF THE INVENTION

It is accordingly an object of the invention to provide a configuration for the low-loss writing of an MRAM that overcomes the hereinafore-mentioned disadvantages of the heretofore-known devices and methods of this general type and that provides a configuration for the low-loss writing of an MRAM that utilizes neither high cell resistances nor short word lines and/or bit lines.

With the foregoing and other objects in view, there is provided, in accordance with the invention, a configuration for low-loss writing of a magneto-resistive random access memory, including a cell field having word lines, bit lines, and memory cells disposed in the cell field between respective ones of the word lines and the bit lines. The memory cells are configured to have a voltage drop occur on a selected one of the word lines connected to a particular one of the memory cells when writing into the particular one of the memory cells and to have voltages at the bit lines set to minimize a cell voltage across the memory cells between a selected one of the word lines and individual ones of the bit lines.

In the configuration according to the invention, the voltages at the bit lines and word lines are set such that the cell voltage across the memory cells between the selected word line and the individual bit lines, and between the selected bit line and individual word lines, is minimal.

In the configuration, the cell voltage that arises in the write operation and the parasitic currents flowing through the individual cells are reduced or even eliminated by suitably adjusting or regulating the voltages at the individual bit lines and word lines.

With the objects of the invention in view, there is also provided a configuration for the low-loss writing of a magneto-resistive random access memory, including a cell field having word lines, bit lines, and memory cells disposed in the cell field between respective ones of the word lines and the bit lines. The memory cells are configured to have a voltage drop occur on a selected one of the word lines connected to a particular one of the memory cells when writing into the particular one of the memory cells, the selected word line having two ends, and when a voltage V1 and a voltage V2<V1 are present at a respective one of the two ends of the selected word line, the cell field is configured to have all of the bit lines set to voltages (V1+V2)/2 and to have a maximum cell voltage of ±(V1−V2)/2.

To accomplish the result, there are principally two variants, which will be described in detail below with reference to a selected word line. The relations that are described for the selected word line also substantially apply to a selected bit line. A combination of a selected word line and a selected bit line is also possible: whereas all bit lines are controlled to a voltage of the selected word line, at the same time all word lines are controlled to the voltage of the selected bit line.

(a) When the voltage drop along a word line has the magnitude V1−V2, with V1 being the voltage at one end of the word line and V2 being the voltage at the other end, then all bit lines are set to the voltage (V1−V2)/2. A maximum cell voltage of ±(V1−V2)/2 is then present. Accordingly, the parasitic currents that flow in across the memory cells on one half of the word line flow out again on the other half of the word line. In other words, in the variant, the bit lines are all set to a separate equipotential precisely midway between U1 and U2.

(b) In a second variant, in contrast to variant (a), the voltages of the individual bit lines are not set to an equipotential. Rather, they are individually conditioned to the voltage drop along the word line so that the voltage across the individual memory cells is approximately zero, and practically no parasitic current will flow. Because the measuring of the word line voltage at each individual cell along the selected word line to recover reference voltages demands a large chip area, a reference word line is expediently inserted, which simulates the selected word line and from which the reference voltage is drawn, which is applied to the respective bit line by buffers or isolation amplifiers. To achieve additional savings of chip space, several bit lines can be combined into a group and set to an equipotential corresponding to the mean value of the voltage in a part of the word line that is respectively allocated to the group of bit lines.

In accordance with another feature of the invention, the bit lines are set to a same potential as the selected word line in the parts allocated to the individual bit lines.

In accordance with an added feature of the invention, several of the bit lines are combined into a group, the selected word line has a part allocated to the group, the part having a voltage impressed thereon, and the several bit lines are set to an equipotential corresponding to a mean value of the voltage in the part.

With the objects of the invention in view, there is also provided a configuration for the low-loss writing of an magneto-resistive random access memory, including a cell field having word lines, bit lines, and memory cells disposed in the cell field between respective ones of the word lines and the bit lines. The memory cells are configured to have a voltage drop occur on selected ones of the bit lines connected to a particular one of the memory cells when writing into the particular one of the memory cells and to have voltages at the word lines set to minimize a cell voltage across the memory cells between a selected one of the bit lines and individual ones of the word lines.

With the objects of the invention in view, there is also provided a configuration for the low-loss writing of a magneto-resistive random access memory, including a cell field having word lines, bit lines, and memory cells disposed in the cell field between respective ones of the word lines and the bit lines. The bit lines are configured to have a voltage drop occur on selected ones of the bit lines connected to a particular one of the memory cells when writing into the particular one of the memory cells, the selected bit lines each having two ends, and, when a voltage V1 and a voltage V2<V1 are present at a respective one of the two ends of the selected bit lines, the cell field is configured to have all of the word lines set to voltages (V1+V2)/2 and to have a maximum cell voltage of ±(V1−V2)/2.

In accordance with an additional feature of the invention, the selected ones of the bit lines have parts, and the word lines are set to a same potential as the selected one of the bit lines in the parts allocated to the individual ones of the word lines.

In accordance with yet another feature of the invention, the cell field has a reference bit line simulating the selected one of the bit lines.

In accordance with yet a further feature of the invention, several of the word lines are combined into a group, the selected bit line has a part allocated to the group, the part having a voltage impressed thereon, and the several word lines are set to an equipotential corresponding to a mean value of the voltage in the part.

In accordance with yet an added feature of the invention, several of the word lines are combined into a group, the selected bit line has a part allocated to the group, the part having a voltage impressed thereon, and the several word lines are set to an equipotential corresponding to a mean value of the voltage in the part.

With the objects of the invention in view, there is also provided a method for the low-loss writing of a magneto-resistive random access memory, including the steps of providing memory cells in a cell field between respective word lines and bit lines, creating a voltage drop on a selected one of the word lines connected to a particular one of the memory cells when writing into the particular memory cell, and setting voltages at the bit lines to minimize a cell voltage across the memory cells between the selected word line and each individual one of the bit lines.

With the objects of the invention in view, there is also provided a configuration for the low-loss writing of a magneto-resistive random access memory, including the steps of providing memory cells in a cell field between respective word lines and bit lines, creating a voltage drop on a word line connected to a particular one of the memory cells when writing into the particular memory cell, and setting, when a voltage V1 and a voltage V2<V1 are present at two ends of a selected word line, all bit lines to voltages (V1+V2)/2 such that a maximum cell voltage is ±(V1−V2)/2.

In accordance with yet an additional mode of the invention, the bit lines are set to a same potential as a respective word line in respective parts of the word line allocated to individual bit lines.

In accordance with again another mode of the invention, the selected word line is simulated with a reference word line.

In accordance with again a further mode of the invention, several bit lines are combined into a group, and the group of bit lines are set to an equipotential corresponding to a mean value of a voltage in a part of a word line allocated to the group.

With the objects of the invention in view, there is also provided a method for the low-loss writing of a magneto-resistive random access memory, including the steps of providing memory cells in a cell field between respective word lines and bit lines, creating a voltage drop on selected bit lines connected to a particular one of the memory cells when writing into the particular memory cell, and setting voltages at the word lines to minimize a cell voltage across the memory cells between the selected bit lines and each individual one of the word lines.

With the objects of the invention in view, there is also provided a method for the low-loss writing of a magneto-resistive random access memory, including the steps of providing memory cells in a cell field between respective word lines and bit lines, creating a voltage drop on selected bit lines connected to a particular one of the memory cells when writing into the particular memory cell, and setting, when a voltage V1 and a voltage V2<V1 are present at two ends of a selected bit line, all word lines to voltages (V1+V2)/2 such that a maximum cell voltage is (V1−V2)/2.

In accordance with again an added mode of the invention, the word lines are set to the same potential as a respective bit line in respective parts of the bit line allocated to individual word lines.

In accordance with again an additional mode of the invention, the selected bit line is simulated with a reference bit line.

In accordance with a concomitant mode of the invention, several word lines are combined into a group, and the group of word lines is set to an equipotential corresponding to a mean value of a voltage in a part of a bit line allocated to the group.

Other features that are considered as characteristic for the invention are set forth in the appended claims.

Although the invention is illustrated and described herein as embodied in a configuration for the low-loss writing of an MRAM, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 4A is a diagrammatic illustration of the structure of a prior art memory cell at the crossing of a word line and a bit line in an MRAM; and FIG. 4B is an enlarged diagrammatic illustration of the prior art memory cell shown in FIG. 4A; and FIG. 5 is a schematic circuit diagram of the emergence of parasitic currents in a prior art memory cell.

DESCRIPTION OF THE PREFERRED EMBODIMENTS

Figure 1:
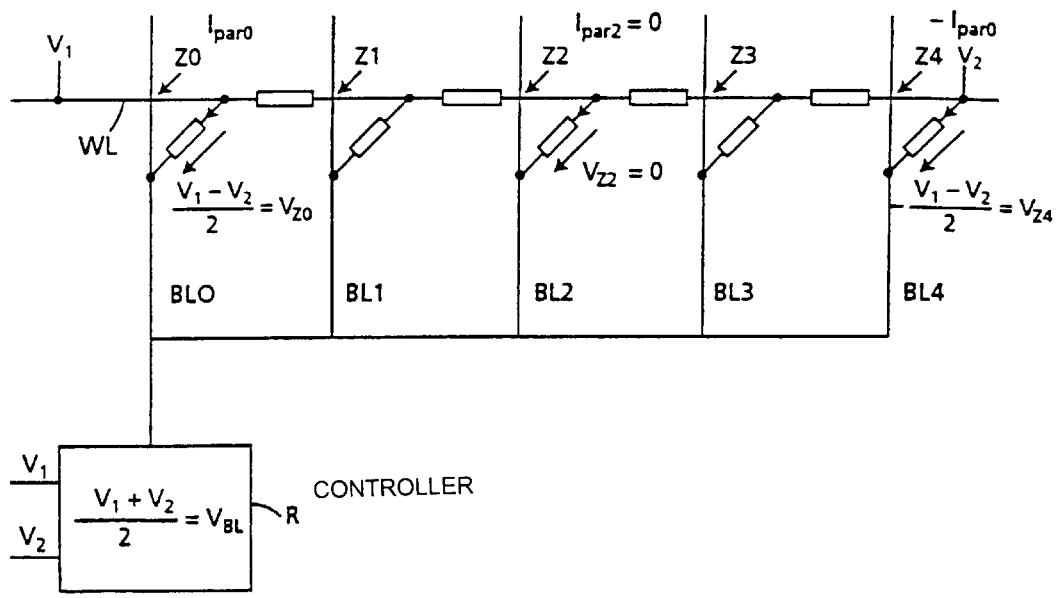
FIG. 1 is a schematic circuit diagram of a first embodiment of the configuration according to the invention.

In all the figures of the drawing, sub-features and integral parts that correspond to one another bear the same reference symbol in each case.

Referring now to the figures of the drawings in detail and first, particularly to FIG. 1 thereof, there is shown a first exemplifying embodiment of the configuration according to the invention. In the exemplifying embodiment, it is assumed that one end of the word line WL is at a potential V1, whereas the other end of the word line WL is charged with potential V2. A voltage drop V1–V2 occurs at the word line WL.

With the aid of a controller R, to which the voltages V1 and V2 are likewise fed, a voltage $(V1+V2)/2=V_{BL}$ is generated, which can be fed to the bit lines BL0, BL1, . . . by way of non-illustrated individual switches.

Figure 2:
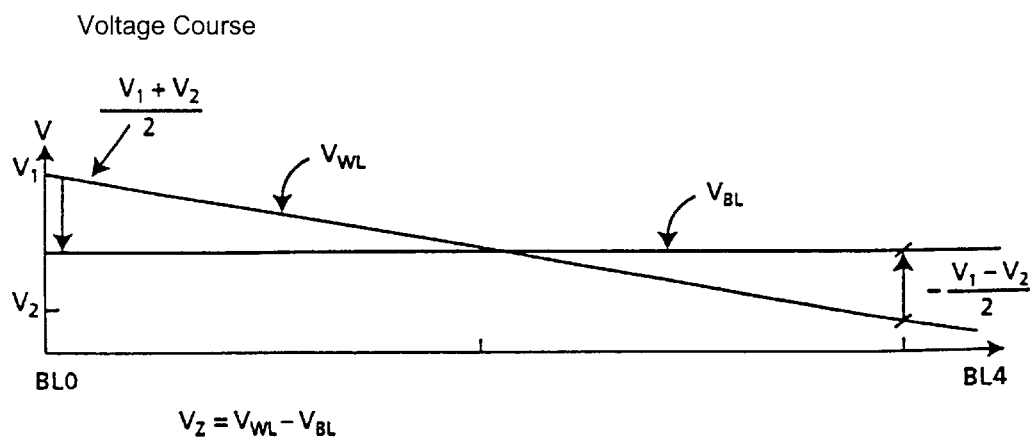
FIG. 2 is a voltage characteristic curve along the word line in the embodiment of FIG. 1.

FIG. 2 illustrates the response of voltage $V_{WL}$ along the word line WL and the response of voltage $V_{BL}$ over the individual bit lines BL. As can be seen in FIG. 2, voltage drops $(V1-V2)/2=V_{Z0}$ and $(V1-V2)/2=V_{Z4}$ occur in the exemplifying embodiment of FIG. 1 across the memory cells at the crossing of the word line WL and the bit line BL0 and at the crossing of the word WL and the bit line BL4, respectively.

By contrast, in the memory cell at the crossing of the bit line BL2 and word line WL, i.e., at the intersection of the voltage curves $V_{WL}$ and $V_{BL}$, a cell voltage $V_{Z2}=0$ prevails.

In the exemplifying embodiment of FIGS. 1 and 2, the parasitic current that flows out on one half of the word line WL by way of the cells Z0 and Z1 flows back in by way of the cells Z3 and Z4. Thus, the parasitic current $I_{par0}$ through the cell Z0 flows back in across the cell Z4 as current $-I_{par0}$, whereby the same relations prevail for the cells Z1 and Z3, and the parasitic current $I_{par2}$ through the parasitic cell Z2 has the value 0, accordingly.

Figure 3:
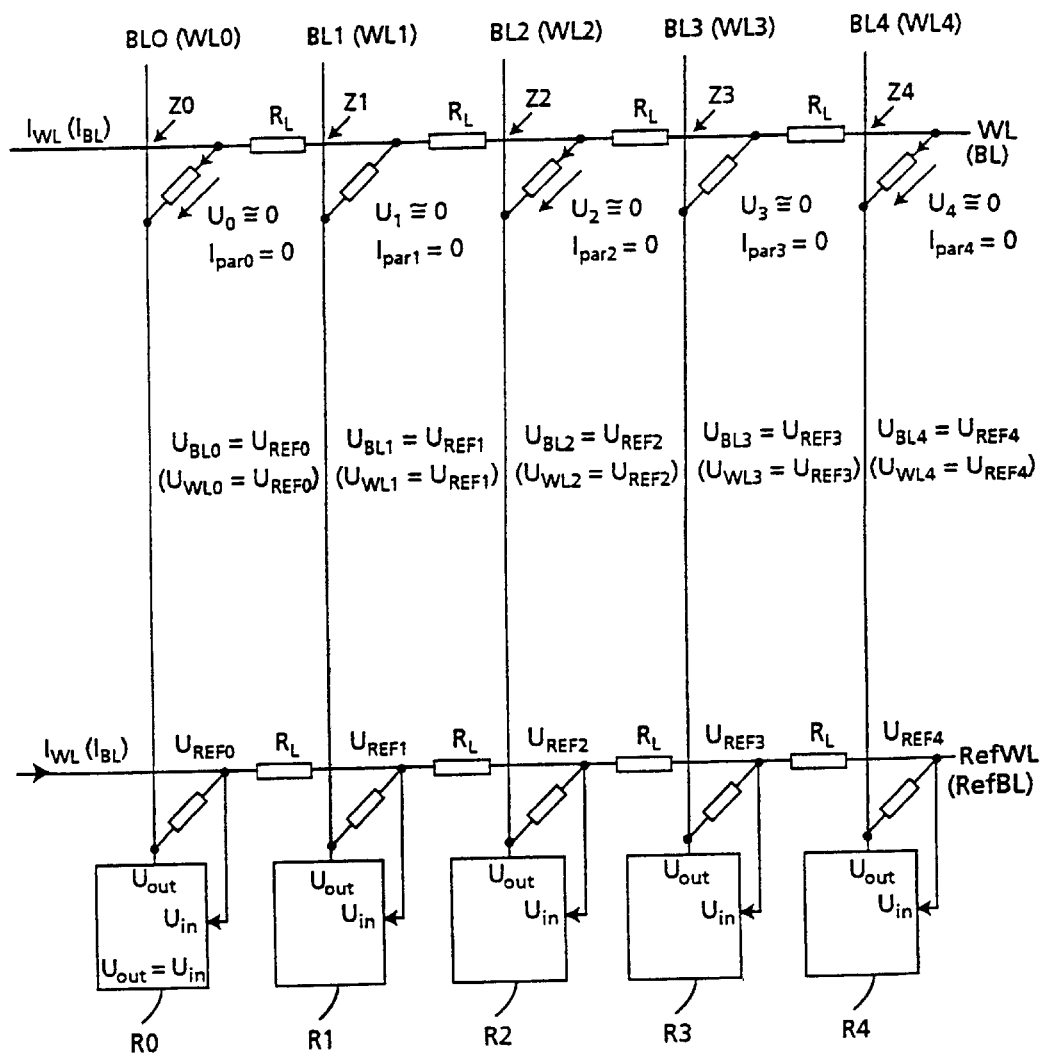
FIG. 3 is a schematic circuit diagram of a second embodiment of the configuration according to the invention.

FIG. 3 illustrates a second exemplifying embodiment of the inventive configuration. In the embodiment of FIG. 3, the bit line voltages $U_{BL0}$, $U_{BL1}$, . . . are not set to an equipotential as in the embodiment of FIGS. 1 and 2, but, instead, are individually conditioned to the voltage drop in the word line WL in which the current $I_{WL}$ flows. As a result, the voltage drops $U_0$, $U_1$, . . . across the individual memory cells Z0, Z1, . . . and the parasitic currents $I_{par0}$, $I_{par1}$, . . . are approximately zero, respectively.

To accomplish the conditioning, a reference word line RefWL is inserted, which simulates the selected word line WL and at which the individual reference voltages $U_{REF0}$, $U_{REF1}$, . . . in the individual reference cells are measured. These reference voltages $U_{REF0}$, $U_{REF1}$, . . . are input into respective controllers R1, R2, . . as voltages $U_{IN}$ and fed to the bit lines BL0, BL1, . . . as output voltages $U_{OUT}$ of these controllers, so that, in general, $U_{BL0}=U_{REF0}$, $U_{BL1}=U_{REF1}$, . . . As such, parasitic currents are out of the question for all practical purposes, with $I_{par0}=0$, $I_{par1}=0$, and so on.

It is also possible to combine several bit lines, for instance the bit lines BL0 and BL1, into a group and set them to an equipotential corresponding to the mean value of the voltage in the allocated part of the word line WL.

As has been mentioned already, the invention can also be applied to a selected bit line in the same fashion. In such a case, the exemplifying embodiment of FIG. 3 includes word lines WL0, WL1, . . . , WL4, a bit line BL, and a reference bit line RefBL, as indicated in parentheses. A current $I_{BL}$ respectively flows in the bit line BL and the reference bit line RefBL, and the word line voltages are determined by the equations $U_{WL0}=U_{REF0}$, $U_{WL1}=U_{REF1}$, . . . , $U_{WL4}=U_{REF4}$.

We claim:

1. A configuration for low-loss writing of a magneto-resistive random access memory, comprising:

a cell field having word lines, bit lines, and memory cells disposed in said cell field between respective ones of said word lines and said bit lines; and said memory cells being configured to have a voltage drop occur on a selected one of said word lines connected to a particular one of said memory cells when writing into said particular one of said memory cells and to have voltages at said bit lines set to minimize a cell voltage across said memory cells between a selected one of said word lines and individual ones of said bit lines.

2. A configuration for the low-loss writing of a magneto-resistive random access memory, comprising:

a cell field having word lines, bit lines, and memory cells disposed in said cell field between respective ones of said word lines and said bit lines;

said memory cells being configured to have a voltage drop occur on a selected one of said word lines connected to a particular one of said memory cells when writing into said particular one of said memory cells, said selected word line having two ends; and when a voltage V1 and a voltage V2<V1 are present at a respective one of said two ends of said selected word line, said cell field being configured to have all of said bit lines set to voltages (V1+V2)/2 and to have a maximum cell voltage of ±(V1−V2)/2.

3. The configuration according to claim 1, wherein:
said selected word line has parts; and
said bit lines are set to a same potential as said selected word line in said parts allocated to said individual ones of said bit lines.

4. The configuration according to claim 3, wherein said cell field has a reference word line simulating said selected word line.

5. The configuration according to claim 3, wherein:
several of said bit lines are combined into a group;
said selected word line has a part allocated to said group, said part having a voltage impressed thereon; and
said several bit lines are set to an equipotential corresponding to a mean value of said voltage in said part.

6. The configuration according to claim 4, wherein:
several of said bit lines are combined into a group;
said selected word line has a part allocated to said group, said part having a voltage impressed thereon; and
said several bit lines are set to an equipotential corresponding to a mean value of said voltage in said part.

7. A configuration for the low-loss writing of an magneto-resistive random access memory, comprising:
a cell field having word lines, bit lines, and memory cells disposed in said cell field between respective ones of said word lines and said bit lines; and
said memory cells being configured to have a voltage drop occur on selected ones of said bit lines connected to a particular one of said memory cells when writing into said particular one of said memory cells and to have voltages at said word lines set to minimize a cell voltage across said memory cells between a selected one of said bit lines and individual ones of said word lines.

8. A configuration for the low-loss writing of a magneto-resistive random access memory, comprising:
a cell field having word lines, bit lines, and memory cells disposed in said cell field between respective ones of said word lines and said bit lines; and
said bit lines being configured to have a voltage drop occur on selected ones of said bit lines connected to a particular one of said memory cells when writing into said particular one of said memory cells, said selected bit lines each having two ends; and
when a voltage V1 and a voltage V2<V1 are present at a respective one of said two ends of said selected bit lines, said cell field being configured to have all of said word lines set to voltages (V1+V2)/2 and to have a maximum cell voltage of ±(V1−V2)/2.

9. The configuration according to claim 7, wherein:
said selected ones of said bit lines have parts; and
said word lines are set to a same potential as said selected one of said bit lines in said parts allocated to said individual ones of said word lines.

10. The configuration according to claim 9, wherein said cell field has a reference bit line simulating said selected one of said bit lines.

11. The configuration according to claim 9, wherein:
several of said word lines are combined into a group;
said selected one of said bit lines has a part allocated to said group, said part having a voltage impressed thereon; and
said several word lines are set to an equipotential corresponding to a mean value of said voltage in said part.

12. The configuration according to claim 10, wherein:
several of said word lines are combined into a group;
said selected one of said bit lines has a part allocated to said group, said part having a voltage impressed thereon; and
said several word lines are set to an equipotential corresponding to a mean value of said voltage in said part.

13. A method for the low-loss writing of a magneto-resistive random access memory, which comprises:
providing memory cells in a cell field between respective word lines and bit lines;
creating a voltage drop on a selected one of the word lines connected to a particular one of the memory cells when writing into the particular memory cell; and
setting voltages at the bit lines to minimize a cell voltage across the memory cells between the selected word line and each individual one of the bit lines.

14. A configuration for the low-loss writing of a magneto-resistive random access memory, which comprises:
providing memory cells in a cell field between respective word lines and bit lines;
creating a voltage drop on a word line connected to a particular one of the memory cells when writing into the particular memory cell; and
setting, when a voltage V1 and a voltage V2<V1 are present at two ends of a selected word line, all bit lines to voltages (V1+V2)/2 such that a maximum cell voltage is ±(V1−V2)/2.

15. The method according to claim 13, which further comprises setting the bit lines to a same potential as a respective word line in respective parts of the word line allocated to individual bit lines.

16. The method according to claim 15, which further comprises simulating the selected word line with a reference word line.

17. The method according to claim 15, which further comprises:
combining several bit lines into a group; and
setting the group of bit lines to an equipotential corresponding to a mean value of a voltage in a part of a word line allocated to the group.

18. The method according to claim 16, which further comprises:
combining several bit lines into a group; and
setting the group of bit lines to an equipotential corresponding to a mean value of a voltage in a part of a word line allocated to the group.

19. A method for the low-loss writing of a magneto-resistive random access memory, which comprises:
providing memory cells in a cell field between respective word lines and bit lines;
creating a voltage drop on selected bit lines connected to a particular one of the memory cells when writing into the particular memory cell; and
setting voltages at the word lines to minimize a cell voltage across the memory cells between the selected bit lines and each individual one of the word lines.

20. A method for the low-loss writing of a magneto-resistive random access memory, which comprises:
providing memory cells in a cell field between respective word lines and bit lines;
creating a voltage drop on selected bit lines connected to a particular one of the memory cells when writing into the particular memory cell; and setting, when a voltage V1 and a voltage V2<V1 are present at two ends of a selected bit line, all word lines to voltages (V1+V2)/2 such that a maximum cell voltage is ±(V1−V2)/2.

21. The method according to claim 19, which further comprises setting the word lines to a same potential as a respective bit line in respective parts of the bit line allocated to individual word lines.

22. The method according to claim 21, which further comprises simulating the selected bit line with a reference bit line.

23. The method according to claim 21, which further comprises:

combining several word lines into a group; and setting the group of word lines to an equipotential corresponding to a mean value of a voltage in a part of a bit line allocated to the group.

24. The method according to claim 22, which further comprises:

combining several word lines into a group; and setting the group of word lines to an equipotential corresponding to a mean value of a voltage in a part of a bit line allocated to the group.

* * * * *